United States Patent [19]
Nakahama et al.

[11] Patent Number: 6,141,217
[45] Date of Patent: *Oct. 31, 2000

[54] ENCLOSED CONTROL DEVICE

[75] Inventors: Takafumi Nakahama; Takayuki Ishii; Tomohiko Tanimoto, all of Mie, Japan

[73] Assignee: Kabushiki Kaisha Toshiba, Kanagawa-Ken, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/164,742

[22] Filed: Oct. 1, 1998

[30] Foreign Application Priority Data

Oct. 3, 1997 [JP] Japan .................................. 9-271619

[51] Int. Cl.$^7$ ........................................ H05K 7/20
[52] U.S. Cl. .................. 361/694; 361/690; 361/695; 361/704; 361/720; 174/16.1; 165/104.33; 165/104.34; 165/185
[58] Field of Search ................ 361/689–691, 361/694, 695–697, 704; 174/15.1, 16.1–16.3; 165/80.2, 80.3, 104.33, 104.34, 122, 185; 454/184

[56] References Cited

U.S. PATENT DOCUMENTS

| 2,583,906 | 1/1952 | Van Guilder | 165/104.34 |
|---|---|---|---|
| 2,654,583 | 10/1953 | Treanor | 165/104.34 |
| 4,027,205 | 5/1977 | Frederick | 361/694 |
| 4,327,398 | 4/1982 | Christison | 361/695 |
| 4,820,978 | 4/1989 | Hirota | 324/166 |
| 4,845,379 | 7/1989 | Carlsten | 327/20 |
| 5,424,915 | 6/1995 | Katooka et al. | 361/695 |
| 5,612,677 | 3/1997 | Baudry | 340/584 |
| 5,731,953 | 3/1998 | Sakurai | 361/695 |
| 5,745,041 | 4/1998 | Moss | 340/635 |

*Primary Examiner*—Leo P. Picard
*Assistant Examiner*—Boris L. Chervinsky
*Attorney, Agent, or Firm*—Limbach & Limbach, LLP

[57] ABSTRACT

In an enclosed control device including a casing enclosing an electronic circuit in a closed state, a centrifugal fan is also enclosed in the casing for enhancing the cooling of the electronic circuit. With a smoothing capacitor and a semiconductor element heating up, a temperature in the casing increases. Air flows to the side of the centrifugal fan. After passing through the centrifugal fan, the air disperses in the directions along the inner wall of the casing. This flow of air enhances heat transmission from the heated up smoothing capacitor and the semiconductor element to the air, and heat transmission from the air to the casing.

8 Claims, 11 Drawing Sheets

ENCLOSED CONTROL DEVICE

BACKGROUND OF THE INVENTION

1. Field of the Invention

This invention relates to an enclosed control device comprising a casing enclosing an electronic circuit in a closed state and cooling means for cooling the electronic circuit.

2. Description of the Prior Art

Variable speed power induction motors have conventionally been known as inverter motors and have capacities ranging between 0.4 and 3.7 kW. The inverter motor comprises an electric motor and an inverter assembly or an inverter mounted integrally on the motor. The inverter comprises a metal casing mounted to a motor frame and an inverter circuit or electronic circuit disposed in the casing.

The power motors are sometimes used in severe environments. For example, the power motors are used in the water as submersible pump motors, mounted as a power source on a machine producing a large amount of dust, or trampled down by muddy feet of operators. Accordingly, the inverter casing mounted on the motor frame requires the same strength as the motor frame, dust proof, and waterproof in the inverter motors serving as the above-described power motors. The electronic circuit heats up in the casing of the inverter assembly of the above-described type or the enclosed control device. The heated electronic circuit needs to be cooled. In the prior art, the electronic circuit have been cooled by natural radiation from the casing or a cooling device such as a fan is provided outside the casing for force-cooling the casing so that air in the casing and accordingly the electronic circuit are cooled.

In the above-described case, however, the casing requires the same strength as the motor frame. This increases the wall thickness of the casing and also raises its heat resistance. In the prior art, both the natural radiation and the forced radiation depend upon that heat in the casing is transmitted by natural convection to an upper wall of the casing. Consequently, the electronic circuit is not sufficiently cooled. This reduces the life of the product.

SUMMARY OF THE INVENTION

Therefore, an object of the present invention is to provide an enclosed control device which can enhance the cooling of the electronic circuit, thereby improving the lives of electronic circuit components.

To achieve the object, the present invention provides an improved enclosed control device comprising a casing, an electronic circuit provided in the casing in a closed state, agitating means provided in the casing for agitating air therein, and driving means for driving the agitating means.

According to the above-described control device, when the electronic circuit heats up in the casing, heat generated by the electronic circuit is transmitted to air in the casing. The heat is further transmitted to the casing. Since the air in the casing is agitated by the agitating means, a flow of air enhances transmission of heat from the electronic circuit to the air and from the air to the casing. Consequently, the cooling of the electronic circuit can be enhanced and accordingly, the life of the product can be improved.

In a preferred form, the casing is provided on a dynamoelectric machine and the rotating member rotating the agitating means is rotated by a rotational shaft of the dynamoelectric machine. Since the agitating means is rotated by the rotational shaft of the dynamoelectric machine, no driving means dedicated to the agitating means is required. Consequently, the number of parts can be reduced. In this construction, the rotating member forms a part of the rotational shaft of the dynamoelectric machine and has a smaller diameter than the rotational shaft so that an amount of heat transmitted from the dynamoelectric machine side to the casing is limited. For the same purpose, the rotating member is discrete from the rotational shaft of the dynamoelectric machine, or the agitating means is made of a material having a smaller heat conductivity than a material of the rotating member. Furthermore, the agitating means includes a cylindrical portion covering the rotating member.

In another preferred form, the enclosed control device further comprises rotation detecting means for detecting rotation of the rotational shaft of the dynamoelectric machine. In this case, a member composing the rotation detecting means serves as a part of a member at a side of the agitating means. Consequently, the rotation detecting means can be disposed in the casing and yet, an increase in the number of parts can be restrained.

In further another preferred form, the casing is provided on an outer frame of dynamoelectric machine to define a closed space together with the outer frame. A boundary wall member divides the closed space into an electronic circuit side and a dynamoelectric machine side. The boundary wall member has a vent hole communicating between an interior of the casing and an interior of the outer frame. In this construction, a flow of air set up by the agitating means is circulated through the vent hole of the boundary wall member into the closed space. Consequently, a stator of the dynamoelectric machine can be cooled as well as the electronic circuit.

In further another preferred form, the electronic circuit includes a capacitor and the agitating means comprises at least one of a centrifugal fan and a mixed flow fan. The capacitor is disposed at a suction side of the agitating means. In this arrangement, the capacitor includes a longitudinally middle portion opposed to a central suction area of the agitating means. When a plurality of the capacitors are provided, each capacitor is preferably disposed on a plane substantially perpendicular to an axis of rotation of the agitating means at the suction side of the agitating means. Furthermore, the capacitors are preferably disposed symmetrically about a center of a blast area of the agitating means. Moreover, the capacitors are preferably dispersed on an arcuate plane at the suction side of the agitating means. The arcuate plane has a curved side opposed to the blast area of the agitating means. Consequently, the capacitors can efficiently be cooled.

In further another preferred form, a part of components of the rotation detecting means or a printed circuit board for the electronic circuit is disposed at a side opposite the suction side of the agitating means in the casing. Additionally, the enclosed control device preferably further comprises a terminal block provided in the casing so as to be spaced away from the agitating means toward an outer periphery of the agitating means. Consequently, an efficient cooling can be achieved.

BRIEF DESCRIPTION OF THE DRAWINGS

Other objects, features and advantages of the present invention will become clear upon reviewing the following description of the preferred embodiments, made with reference to the accompanying drawings, in which.

DETAILED DESCRIPTION OF THE PREFERRED EMBODIMENTS

Figure 1:
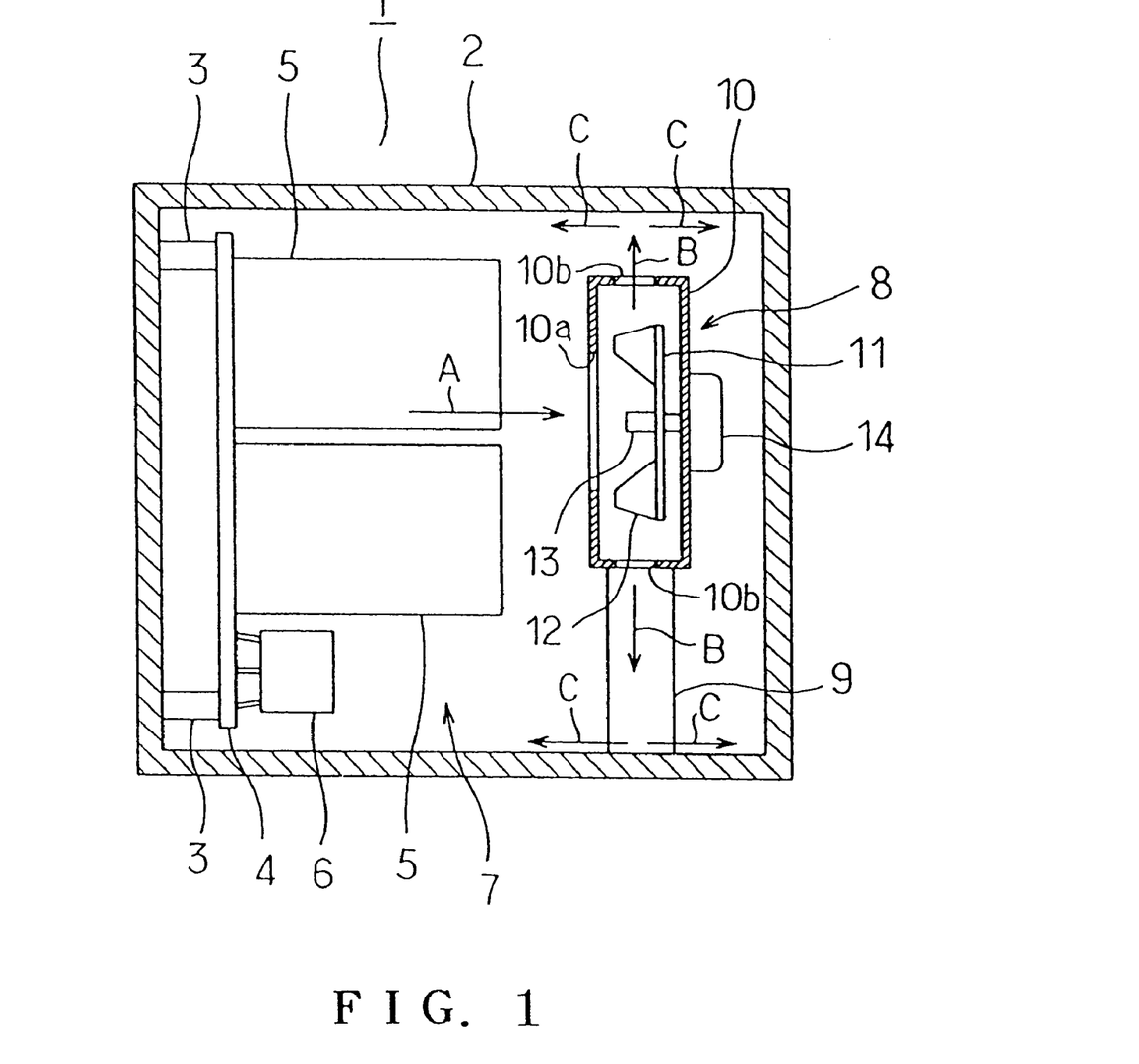
FIG. 1 is a longitudinally sectional side view of the enclosed control device of a first embodiment in accordance with the present invention.

A first embodiment of the present invention will be described with reference to FIG. 1. The invention is applied to an inverter for a three-phase induction motor. The inverter 1 serving as the enclosed control device comprises a metal casing 2 of an enclosed structure. The casing 2 encloses a printed circuit board 4 positioned by mounting legs 3. A smoothing capacitor 5 and a semiconductor switching element 6 such as a transistor are mounted on the surface of the circuit board 4 or a right-hand side thereof as viewed in FIG. 1. A diode composing a rectifier circuit is also mounted on the circuit board 4 although neither of them is shown. Thus, the circuit board 4, the smoothing capacitor 5 and the semiconductor element 6 compose an inverter circuit 7 serving as an electronic circuit and comprising the rectifier circuit, an inverter main circuit and a control circuit.

The smoothing capacitor 5 considerably heats up or generates heat since a motor current flows therethrough. A centrifugal fan 8 serving as agitating means in the invention is held by mounting legs 9 so as to be opposed to the smoothing capacitor 5 in the casing 2. The centrifugal fan 8 comprises a circular end plate 11 and a fan blade 12 mounted on the end plate 11. The end plate 11 and the fan blade 12 are enclosed in a housing 10. The fan blade 12 is mounted on a rotational shaft 13 of a fan motor 14 disposed outside the housing 10. The housing 10 has an axially open air inlet 10a and a centrifugally open air outlet 10b.

A cooling fan (not shown) discrete from the inverter 1 is provided outside the casing 2. The cooling fan blows air against an outer wall of the casing 2 to thereby cool the inverter 1 indirectly. A predetermined AC voltage from an AC power supply (not shown) is applied to each of the inverter circuit 7 and the fan motor 14.

The operation of the inverter 1 will now be described. The AC voltage from the AC power supply is supplied to the inverter circuit 7 so that the latter is driven. Upon drive of the inverter circuit 7, the smoothing capacitor 5 and the semiconductor element 6 generate heat. Furthermore, when the AC voltage is applied to the fan motor 14 so that the latter is driven, the centrifugal fan 8 is driven, namely, the fan blade 12 is rotated together with the end plate 11 by the rotational shaft 13.

A flow of air in the casing 2 will be described. A temperature of air in the casing 2 rises as the smoothing capacitor 5 and the semiconductor element 6 generate heat. Since the centrifugal fan 8 is being driven, a hot air is caused to axially flow toward the fan 8 (in the direction of arrow A in FIG. 1). The air flows through the air inlet 10a into the housing 10, further flowing radially through the air outlet 10b toward an inner wall of the casing 2 (in the direction of arrow B in FIG. 1). The air having struck the inner wall is dispersed in the directions along the inner periphery of the casing 2 (see arrows C in FIG. 1). In other words, heat generated by the smoothing capacitor 5 and the semiconductor element 6 is transmitted to the air flowing as described above in the casing 2. The heat is then transmitted with the air to the entire wall surface of the casing 2. The heat transmitted to the casing 2 is dissipated outside the casing 2 by the externally disposed cooling fan.

According to the above-described first embodiment, the centrifugal fan 8 is provided in the casing 2 for setting up a flow of air in the casing. The centrifugal fan 8 enhances heat transmission from the smoothing capacitor 5 and the semiconductor element 6 to the air in the casing 2. Furthermore, heat transmission from the air to the casing 2 is also enhanced. Consequently, the cooling of the smoothing capacitor 5 and the semiconductor element 6 can be enhanced and accordingly, the life of the product can be improved.

Figure 2:
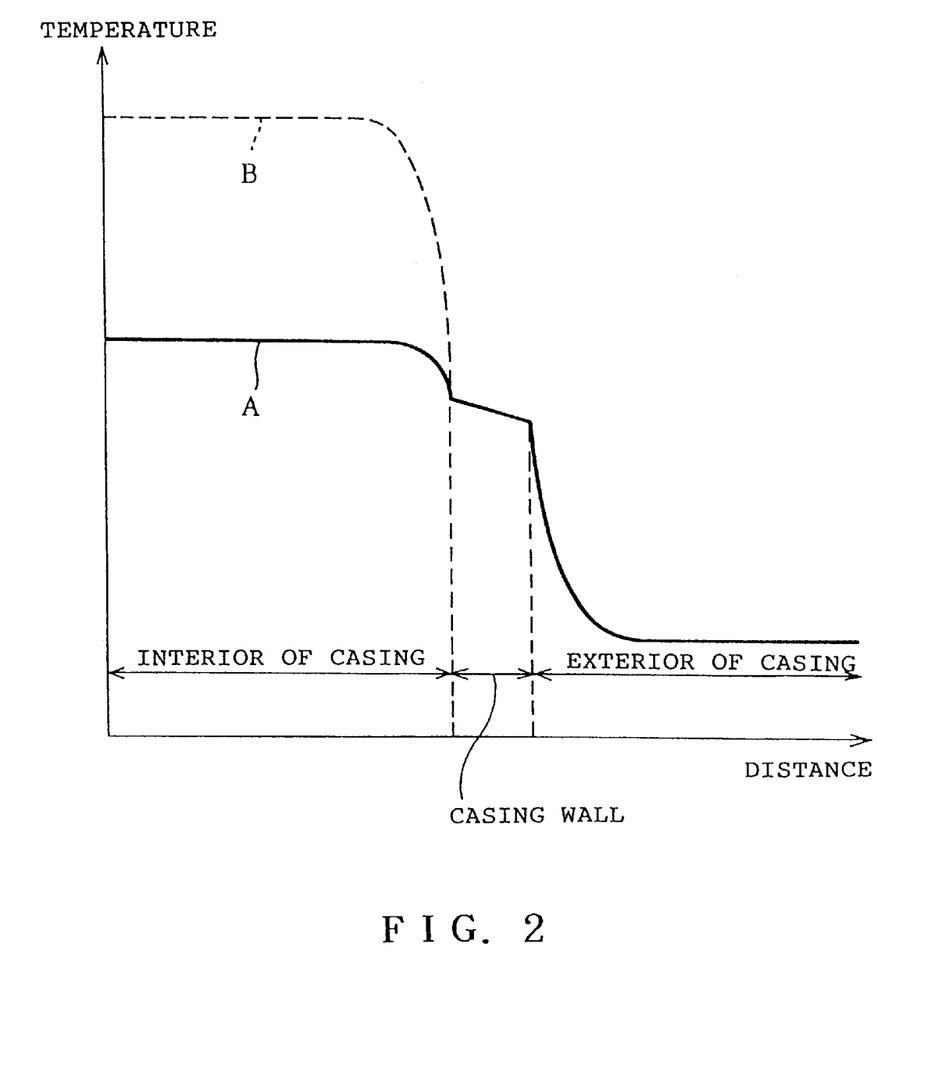
FIG. 2 is a graph showing the relationship between the temperature in the casing and the distance from the surface of the smoothing capacitor in the casing.

The inventors made an experiment to confirm effects achieved from the provision of the centrifugal fan 8 in the casing 2. The experimental results will now be described with reference to FIG. 2. In FIG. 2, the axis of ordinates denotes a temperature and the axis of abscissas denotes a distance from the surface of the smoothing capacitor 5. Solid line A denotes the construction in which the centrifugal fan 8 is provided in the casing 2 (the construction of the present invention). Broken line B denotes the construction in which the centrifugal fan 8 is not provided in the casing 2 (the construction of the prior art). As obvious from the experimental results, the temperature in the casing 2 enclosing the centrifugal fan 8 is decreased more than in the casing 2 devoid of the centrifugal fan 8.

Figure 3:
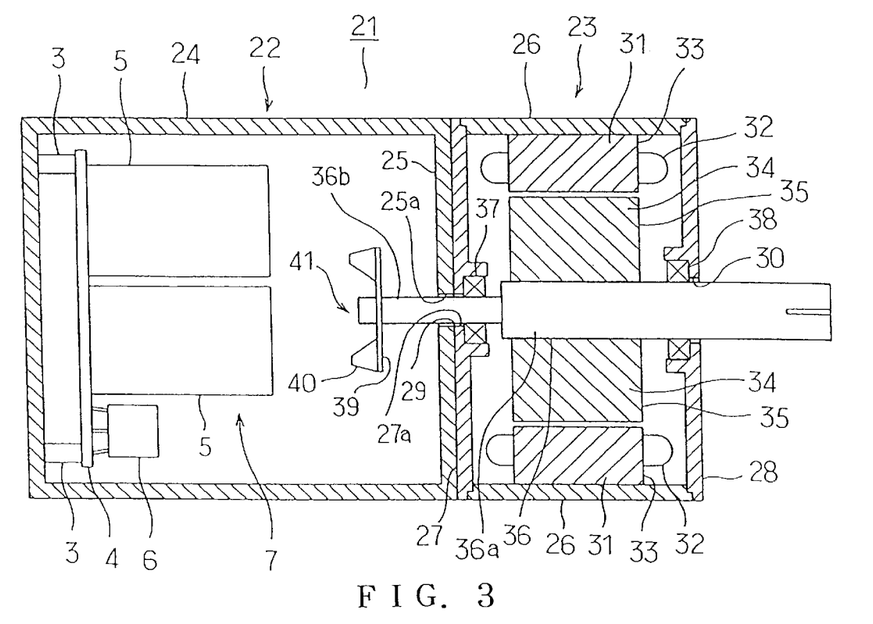
FIG. 3 is a longitudinally sectional side view of the enclosed control device of a second embodiment in accordance with the invention.

FIG. 3 illustrates a second embodiment of the invention. Identical or similar parts in the second embodiment are labeled by the same reference symbols as in the first embodiment. These parts will not be described and only the differences between the first and second embodiments will be described. In the second embodiment, the invention is applied to an integrated electric motor 21 with an integrated inverter. The integrated motor 21 comprises a motor 23 serving as the dynamoelectric machine and an inverter 22 integrated with the motor 23. A casing 24 of the inverter 22 encloses the inverter circuit 7 composed of the printed circuit board 4, the smoothing capacitor 5, the semiconductor element 6, etc. as in the first embodiment. The motor 23 is driven by the inverter circuit 7. The casing 24 has a hole 25a formed at a predetermined location on the right-hand side wall 25 thereof as viewed in FIG. 3. The motor 23 comprises a power three-phase induction motor, for example. The motor 23 includes an axially disposed cylindrical frame 26 and two brackets 27 and 28 mounted on opposite ends of the frame 26 respectively. The bracket 27 has a hole 27a and abuts the side wall 25 of the inverter 22 so that the hole 27a is aligned with the hole 25a of the side wall 25. The holes 25a and 27a constitute a shaft hole 29. Furthermore, the other bracket 28 also has a shaft hole 30 formed to correspond to the hole 27a of the bracket 27.

A stator 33 of the motor 21 is provided inside the frame 26 and comprises a stator core 31 and a winding 32 wound on the stator core 31. A rotor 35 of the motor 21 is provided inside the stator 33 for rotation and comprises a rotor core 34 and conductors (not shown) embedded in the rotor core. A rotational shaft 36 of the rotor 35 includes a shaft body 36a and a reduced diameter portion 36b having a smaller diameter than the shaft body 36a and serving as a rotational member. The reduced diameter portion 36b of the rotational shaft 36 is supported by a bearing 37 provided on the bracket 27 so as to pass through the shaft hole 29. The shaft body 36a is supported by a bearing 38 provided on the bracket 28 so as to pass through the shaft hole 30. The reduced diameter portion 36b of the rotational shaft 36 has a slightly smaller outer diameter than the shaft hole 29. The shaft body 36a has a slightly smaller outer diameter than the shaft hole 30. Accordingly, the rotational shaft 36 extends through the shaft holes 29 and 30 with almost no gap therebetween.

The rotational shaft 36 has at the reduced diameter portion 36b side a distal end to which a centrifugal fan 41 serving as agitating means is attached. The centrifugal fan 41 comprises a circular end plate 39 and a fan blade 40 mounted on the end plate 39. The centrifugal fan 41 is driven when the rotational shaft 36 is rotated upon drive of the motor 23. Each of the end plate 39 and the fan blade 40 is made of a material having a small heat conductivity.

The above-described motor 21 with the integrated inverter operates as follows. The smoothing capacitor 5 and the semiconductor element 6 generate heat when an AC voltage from the AC power supply is applied to the inverter circuit 7 to drive the same. Furthermore, the rotational shaft 36 of the motor 35 is rotated and the centrifugal fan 41 is driven when the inverter circuit 7 supplies the AC voltage to the motor 23 to drive the same. Heat generated by the smoothing capacitor 5 and the semiconductor element 6 increases the temperature of the air in the casing 24 of the inverter 22. The air is axially drawn toward the centrifugal fan 41 side. The air drawn by the centrifugal fan 41 is caused to flow radially toward the inner wall side of the casing 24, striking the inner wall. The air is then dispersed in the directions along the inner periphery. Consequently, the cooling of the smoothing capacitor 5 and the semiconductor element 6 can be enhanced as in the first embodiment.

According to the second embodiment, the same effect can be achieved regarding the motor 21 with the integrated inverter as in the first embodiment. Particularly in the second embodiment, the centrifugal fan 41 is mounted on the rotational shaft 36 of the motor 23 so as to be rotated by the rotating force of the shaft 36. Accordingly, the fan motor 14 dedicated to the cooling in the first embodiment can be eliminated. This can reduce the number of parts and electric power consumption.

The rotational shaft 36 of the motor 23 has a reduced diameter at its inverter 22 side. Consequently, an amount of heat transmitted through the shaft 36 to the inverter 22 side can be restrained. Furthermore, since the centrifugal fan 41 is made of the material having the small heat conductivity, an amount of heat transmitted through the shaft 36 and the fan 41 to the inverter 22 side can be restrained.

Figure 4:
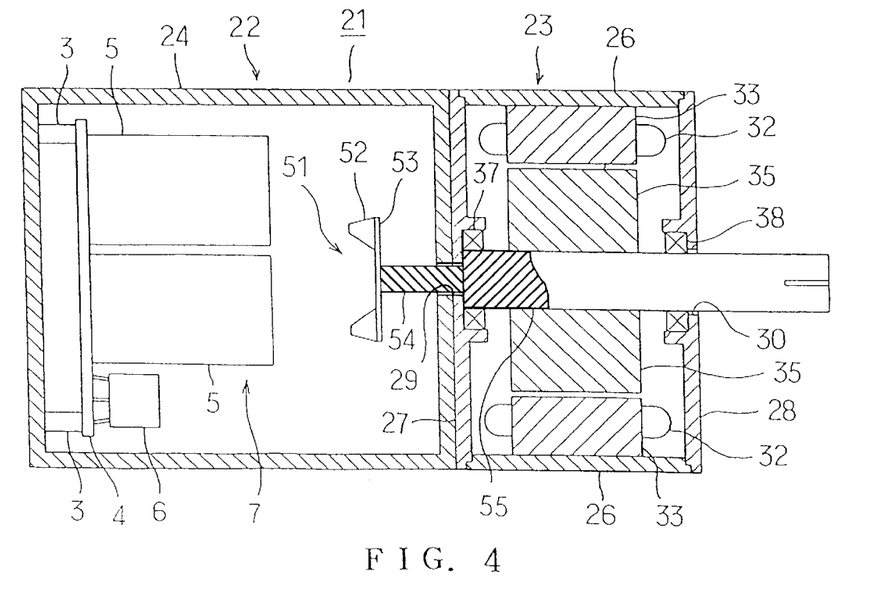
FIG. 4 is a longitudinally sectional side view of the enclosed control device of a third embodiment in accordance with the invention.

FIG. 4 illustrates a third embodiment of the invention. Identical or similar parts in the third embodiment are labeled by the same reference symbols as in the second embodiment. These parts will not be described and only the differences between the second and third embodiments will be described. In the third embodiment, the centrifugal fan 51 serving as the agitating means comprises a fan blade 52 and an end plate 53. The end plate 53 differs from the end plate 39 in the second embodiment. The end plate 54 has an axially extending shaft 53 formed integrally therewith and serving as the rotating member. The shaft 54 is welded coaxially to the distal end of the rotational shaft 55 of the motor 23. When the AC voltage from the AC power supply is supplied to the motor 23 so that the rotational shaft 55 is rotated, the centrifugal fan 51 is rotated together with the shaft 55. In other words, the shaft 54 integral with the end plate 53 corresponds to the reduced diameter portion 36b of the rotational shaft 36 in the second embodiment. Thus, the rotating force of the shaft 55 of the motor 23 is transmitted through the shaft 54 to the centrifugal fan 51, thereby rotating the same.

According to the third embodiment, the same effect can be achieved as in the first embodiment. Particularly in the third embodiment, the shaft 54 discrete from the rotational shaft 55 of the motor 23 is formed integrally on the end plate 53 of the centrifugal fan 51. The rotating force of the shaft 55 is transmitted through the shaft 54 to the centrifugal fan 51. Accordingly, since the shaft 54 can be made of a material having a small heat conductivity, an amount of heat transmitted from the motor 23 side to the inverter 22 side can be restrained.

Figure 5:
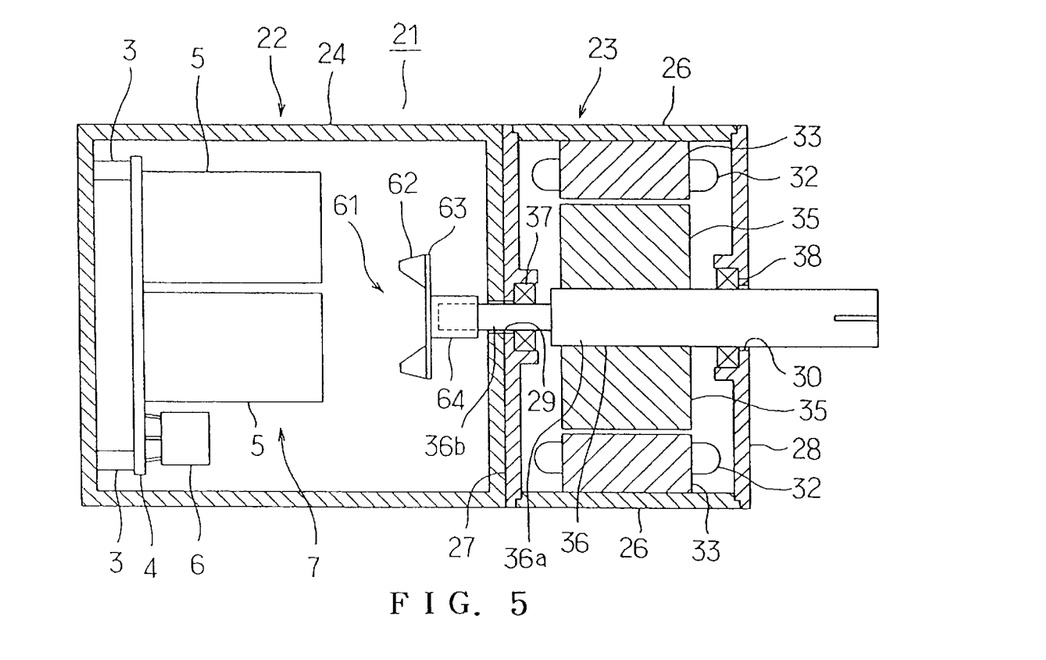
FIG. 5 is a longitudinally sectional side view of the enclosed control device of a fourth embodiment in accordance with the invention.

FIG. 5 illustrates a fourth embodiment of the invention. Identical or similar parts in the fourth embodiment are labeled by the same reference symbols as in the second embodiment. These parts will not be described and only the differences between the second and fourth embodiments will be described. In the fourth embodiment, the centrifugal fan 61 serving as the agitating means comprises a fan blade 62 and an end plate 63. Differing from the end plate 39 in the second embodiment, the end plate 63 has an axially extending cylindrical portion 64 formed integrally therewith. The centrifugal fan 61 is mounted on the distal end of the reduced diameter portion 36b of the shaft 36 so that the cylindrical portion 64 covers the distal end.

According to the fourth embodiment, the same effect can be achieved as in the second embodiment. Particularly in the fourth embodiment, the cylindrical portion 64 provided on the end plate 63 of the centrifugal fan 61 covers the distal end of the reduced diameter portion 36b of the rotational shaft 36 of the motor 23. Consequently, an amount of heat transmitted to the reduced diameter portion 36b of the shaft 36 in the casing 24 is restrained and accordingly, an amount of heat transmitted from the motor 23 side to the inverter 22 side can be restrained.

Figure 6:
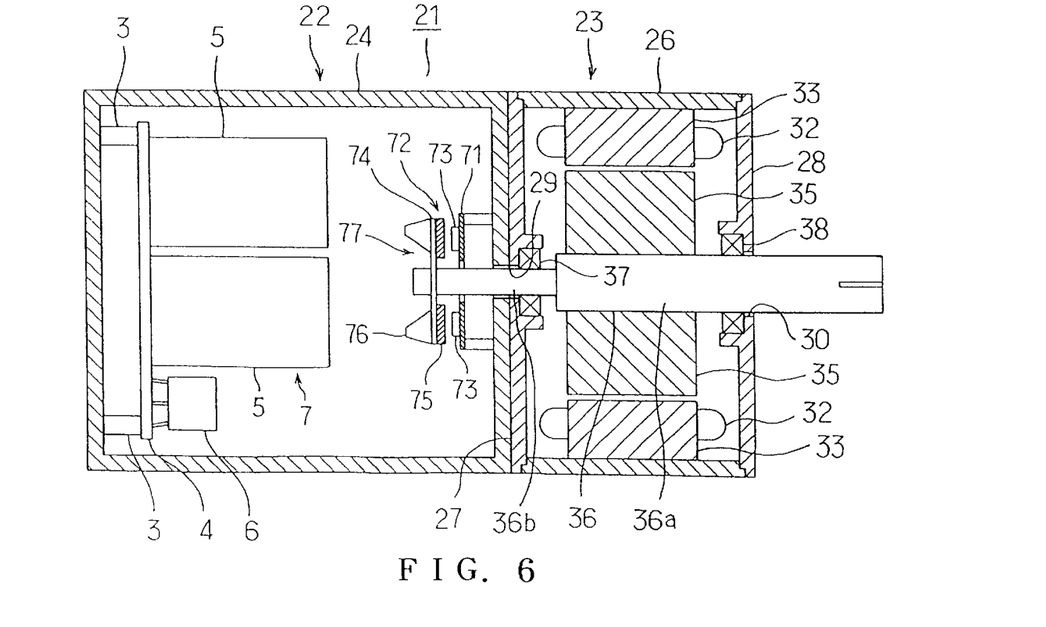
FIG. 6 is a longitudinally sectional side view of the enclosed control device of a fifth embodiment in accordance with the invention.

FIG. 6 illustrates a fifth embodiment of the invention. Identical or similar parts in the fifth embodiment are labeled by the same reference symbols as in the second embodiment. These parts will not be described and only the differences between the second and fifth embodiments will be described. In the fifth embodiment, a base 71 is fixedly provided in the casing 24 of the inverter 22. Sensors 73 each comprising a Hall element, for example, are mounted on a side of the base 71 at the inverter circuit 7 side. The sensors 73 constitute a magnetic sensor 72 serving as rotation detecting means in the invention.

A circular magnet mounting plate 74 is attached to the distal end of shaft 36 at the reduced diameter portion 36b side. Magnets 75 are provided at predetermined intervals along the circumference of the mounting plate 74 on a side thereof at the motor 23 side so that the magnets are opposed to the sensors 73. The magnets 75 exert a magnetic field on the sensors 73.

The mounting plate 74 is rotated with the magnets 75 carried thereon when the motor 23 is driven so that the its rotational shaft 36 is rotated. With the rotation of the plate 74, the magnetic field interlinking the magnets 75 changes. The sensor 73 detects the change in the interlinking magnetic field, thereby detecting rotation of the shaft 36.

The magnet mounting plate 74 is provided with a fan blade 76 and accordingly serves as an end plate for the centrifugal fan. Thus, in the fifth embodiment, the mounting plate 74 which is a component of the magnetic sensor 72 also serves as the component of the centrifugal fan 77.

According to the fifth embodiment, the same effect can be achieved as in the second embodiment. Particularly in the fifth embodiment, the mounting plate 74 which is a component of the magnetic sensor 72 is utilized as the component of the centrifugal fan 77. Consequently, the number of parts can be reduced.

Figure 7:
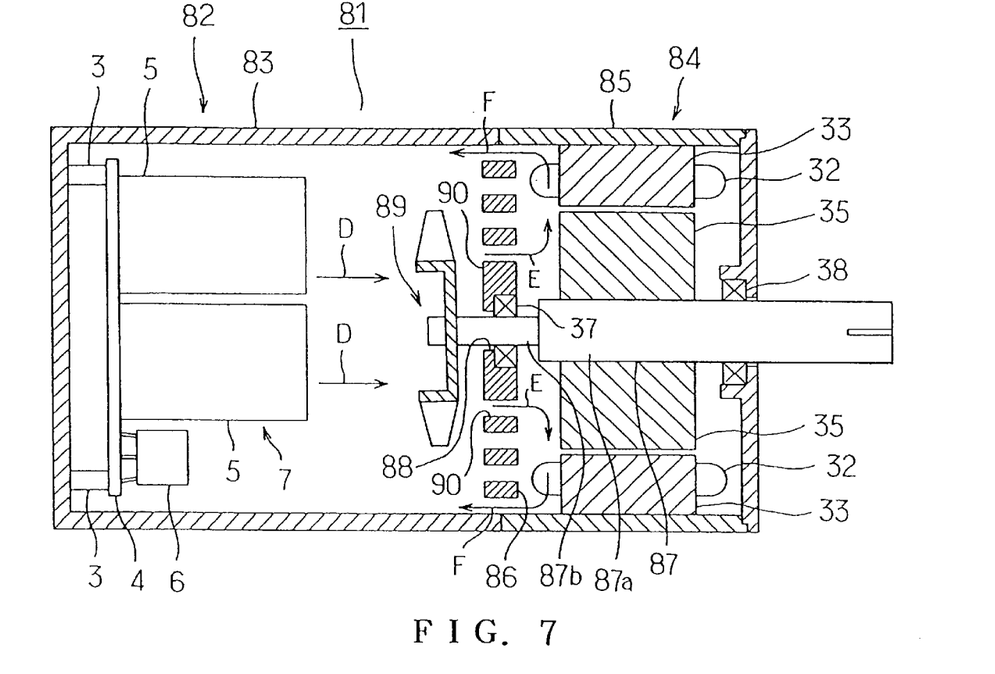
FIG. 7 is a longitudinally sectional side view of the enclosed control device of a sixth embodiment in accordance with the invention.

FIG. 7 illustrates a sixth embodiment of the invention. Identical or similar parts in the sixth embodiment are labeled by the same reference symbols as in the second embodiment. These parts will not be described and only the differences between the second and sixth embodiments will be described. In the motor 81 with the integrated inverter, the sixth embodiment, the casing 83 of the inverter 82 and the frame 85 of the motor 84 are integrated together so that the casing is closed. A boundary wall 86 divides between the interior of the casing 83 and the interior of the frame 85. The boundary wall 86 corresponds to the side wall 25 of the casing 24 and the bracket 27 of the motor 23 adjacent the sidewall 25 in the second embodiment. The casing 83 encloses the inverter circuit 7 whereas the frame 85 of the motor 84 encloses the stator 33 and the rotor 35. The rotational shaft 87 of the rotor 35 comprises the body 87a and the reduced diameter portion 87b as in the shaft 36 in the second embodiment. The reduced diameter portion 87b is supported on a bearing 37, extending through a shaft hole 88 formed in the boundary wall 86 into the interior of the casing 83 at the inverter 82 side. An axial fan 89 serving as the agitating means is mounted on the distal end of the reduced diameter portion 87b of the shaft 87. The boundary wall 86 is formed with a plurality of vent holes 90 communicating between the interior of the casing 83 of the inverter 82 and the interior of the frame 85 of the motor 84.

The above-described motor 81 operates as follows. The motor 84 is driven so that the rotational shaft 87 thereof and accordingly the axial fan 89 are rotated when the AC voltage from the inverter circuit 7 is applied to the motor 84. In this state, heat generated by the smoothing capacitor 5 and the semiconductor element 6 increases the temperature of the air in the casing 83 of the inverter 82. The air is axially drawn toward the axial fan 89 side as shown by arrows D in FIG. 7. The air drawn by the axial fan 89 is caused to flow axially through the central vent holes 90 toward the motor 84 side as shown by arrows E in FIG. 7. The air then strikes axial end faces of the rotor 85 and the stator 83, returning to the inverter 82 side as shown by arrows F in FIG. 7. Thus, the heat generated by the smoothing capacitor 5 and the semiconductor element 6 is transmitted to the air in the casing 83 and the frame 85, being further transmitted to the casing 83 and the frame 85.

According to the sixth embodiment, the axial fan 89 is provided at the inverter 82 side to set up a flow of air in the casing 83 and the frame 85. The centrifugal fan 89 promotes heat transmission from the smoothing capacitor 5 and the semiconductor element 6 to the air in the casing 83. Furthermore, heat transmission from the air to the casing 83 and the frame 85 is also enhanced. Consequently, the same effect can be achieved in the sixth embodiment as in the second embodiment. Particularly in the sixth embodiment, the cooling of the stator 33 and the rotor 35 of the motor 84 can be enhanced.

Figure 8:
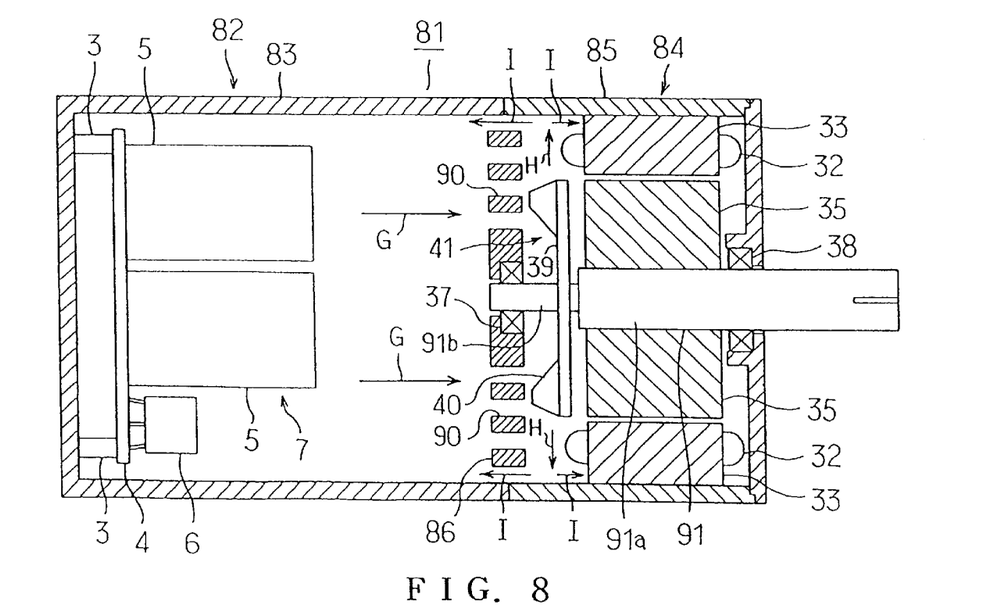
FIG. 8 is a longitudinally sectional side view of the enclosed control device of a seventh embodiment in accordance with the invention.

FIG. 8 illustrates a seventh embodiment of the invention. Identical or similar parts in the seventh embodiment are labeled by the same reference symbols as in the sixth embodiment. These parts will not be described and only the differences between the sixth and seventh embodiments will be described. Although the axial fan 89 is disposed at the inverter 82 side or in the casing 83 in the sixth embodiment, the centrifugal fan 41 is mounted on the reduced diameter portion 91b of the rotational shaft 91 in the frame 85 of the motor 84.

The motor of the seventh embodiment operates as follows. The motor 84 is driven so that the rotational shaft 91 and accordingly the centrifugal fan 41 are rotated when the AC voltage from the inverter circuit 7 is applied to the motor 84. In this state, heat generated by the smoothing capacitor 5 and the semiconductor element 6 increases the temperature of the air in the casing 83 of the inverter 82. The air is axially drawn toward the centrifugal fan 41 from the inverter 82 side through the vent holes 90 to the motor 84 side, as shown by arrows G in FIG. 8. The air drawn by the centrifugal fan 41 is discharged radially through the vent holes 90 toward the inner periphery of the frame 85 as shown by arrows H in FIG. 8. The air then strikes the inside face of the frame 85 and the stator 33, being dispersed in the directions along the frame 85. Part of the air flows through the vent holes 90 to the inverter 82 side, as shown by arrows I in FIG. 8. Thus, the heat generated by the smoothing capacitor 5 and the semiconductor element 6 is transmitted to the air in the casing 83, being further transmitted to the casing 83 and the frame 85.

According to the seventh embodiment, the centrifugal fan 41 is provided at the motor 84 side to set up a flow of air in the casing 83 and the frame 85. The centrifugal fan 41 enhances heat transmission from the smoothing capacitor 5 and the semiconductor element 6 to the air in the casing 83. Furthermore, heat transmission from the air to the casing 83 and the frame 85 is also enhanced. Particularly in the seventh embodiment, the cooling of the stator 33 and the rotor 35 of the motor 84 can be enhanced.

Figure 9:
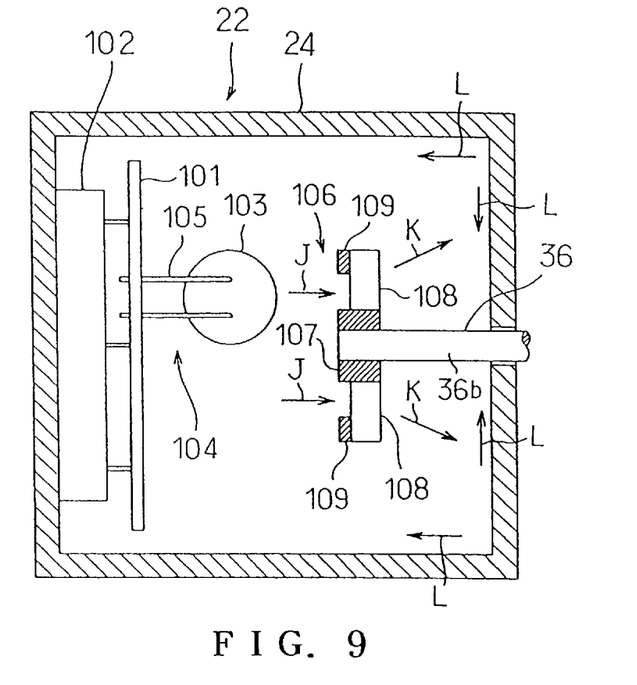
FIG. 9 is a longitudinally sectional side view of the enclosed control device of an eighth embodiment in accordance with the invention.
Figure 10:
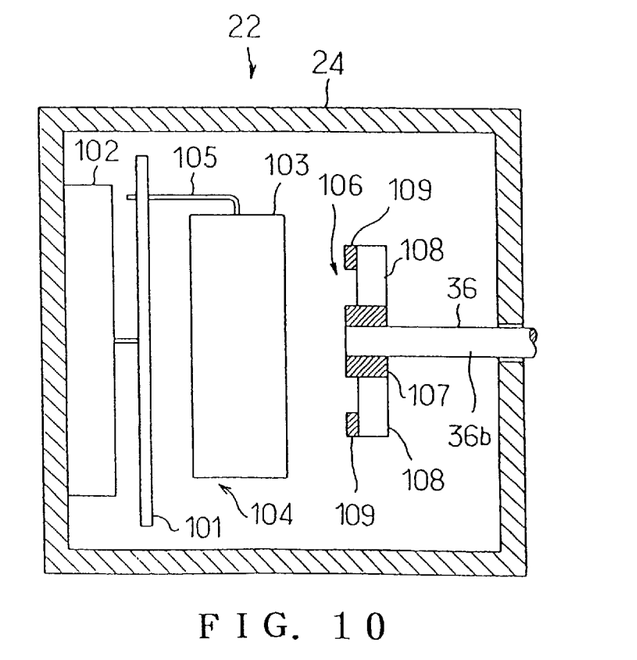
FIG. 10 is a plan view of the enclosed control device.

FIGS. 9 and 10 illustrate an eighth embodiment of the invention. Identical or similar parts in the eighth embodiment are labeled by the same reference symbols as in the second embodiment. These parts will not be described and only the differences between the second and eighth embodiments will be described. The motor 23 is not shown in the drawings.

In the eighth embodiment, the casing 24 of the inverter 22 encloses a printed circuit board 101 and an inverter circuit 104 comprising a semiconductor element 102 mounted on one side of the board 101, and a columnar smoothing capacitor 103 mounted on the other side of the board 101, instead of the inverter circuit 7 in the first to seventh embodiments. The smoothing capacitor 103 is mounted on the circuit board 101 so that a longitudinal side thereof faces in parallel with the board 101. An entire left-hand side of the semiconductor element 102 is adjacent to the inside of the casing 24 so that heat is easily radiated, as viewed in FIGS. 9 and 10.

A mixed flow fan 106 serving as the agitating means is mounted on the distal end of the reduced diameter portion 36b of the shaft 36 of the motor 23 so that the suction side thereof is opposed to the side of the smoothing capacitor 103. The mixed flow fan 106 comprises a fan blade 108 radially mounted on an outer circumference of a cylindrical boss 107. An annular shroud 109 holds the fan blades 108 near the distal end thereof. Skew angles of the blades are set so that a flow of air diverges obliquely backward.

The motor of the eighth embodiment operates as follows. The smoothing capacitor 103 and the semiconductor element 102 heat up when an AC voltage from the AC power supply is applied to the inverter circuit 104 to drive the same. Furthermore, the rotational shaft 36 of the motor 23 is rotated so that the mixed flow fan 106 is driven. Heat generated by the smoothing capacitor 103 and the semiconductor element 102 increases the temperature of the air in the casing 24 of the inverter 22. The air is axially drawn toward the mixed flow fan 106 side as shown by arrows J in FIG. 9. The air drawn by the mixed flow fan 106 is caused to flow obliquely backward, striking the inner wall of the casing 24, as shown by arrows K in FIG. 9. The air is then dispersed in the directions along the inner periphery as shown by arrows L in FIG. 9. Consequently, the cooling of the smoothing capacitor 104 and the semiconductor element 102 can be enhanced.

According to the eighth embodiment, the smoothing capacitor 103 is disposed at the suction side of the mixed flow fan 106. Accordingly, the cooling can be enhanced even when an amount of heat generated by the smoothing capacitor 103 is relatively large. Consequently, the service life of the product can be increased.

Figure 11:
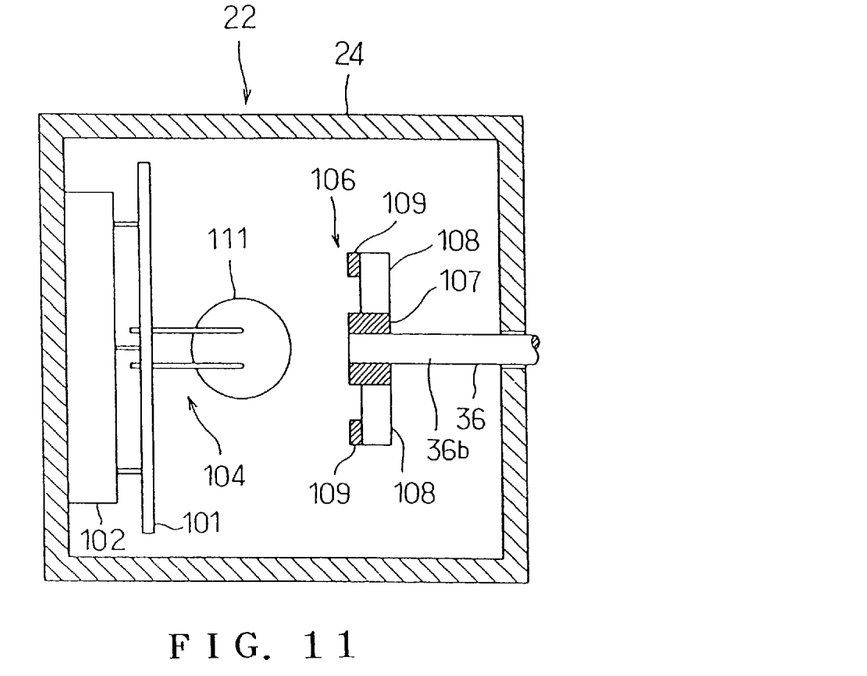
FIG. 11 is a longitudinally sectional side view of the enclosed control device of a ninth embodiment in accordance with the invention.

FIG. 11 illustrates a ninth embodiment of the invention. Identical or similar parts in the ninth embodiment are labeled by the same reference symbols as in the eighth embodiment. These parts will not be described and only the differences between the eighth and ninth embodiments will be described. In the ninth embodiment, the cylindrical smoothing capacitor 111 is mounted on the printed circuit board 101 so that its axially central portion is opposed to the axis of rotation of the mixed flow fan 106, namely, the central blast area. Particularly in the ninth embodiment, a longitudinally central portion of the smoothing capacitor 111 is opposed to the center of rotation of the mixed flow fan 106. Consequently, since air flows symmetrically in the casing 24, the cooling efficiency can be improved regarding the smoothing capacitor 111.

Figure 12:
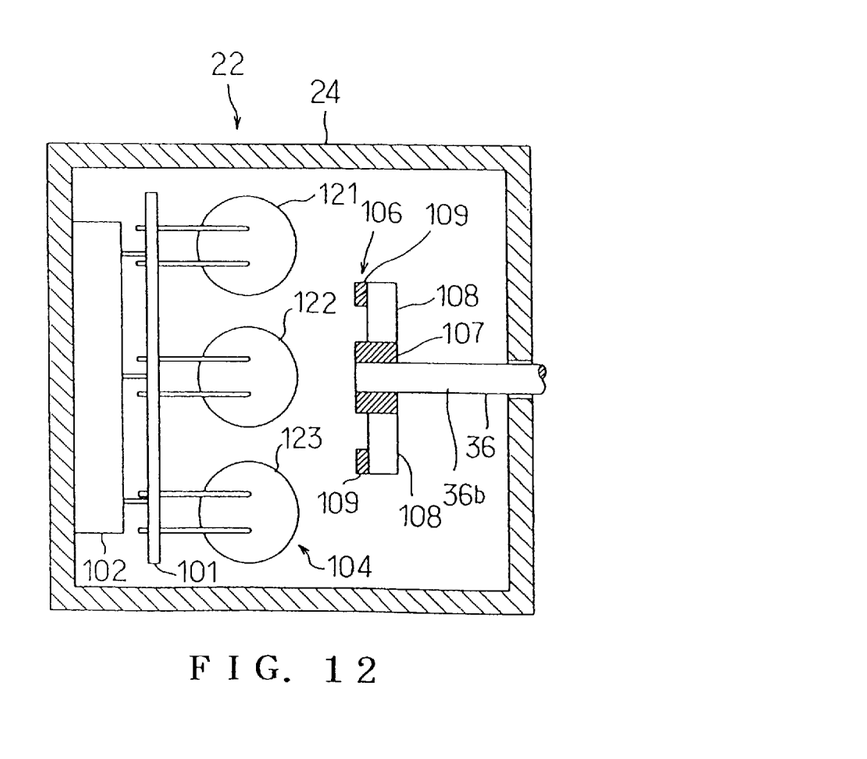
FIG. 12 is a longitudinally sectional side view of the enclosed control device of a tenth embodiment in accordance with the invention.

FIG. 12 illustrates a tenth embodiment of the invention. Identical or similar parts in the tenth embodiment are labeled by the same reference symbols as in the eighth embodiment. These parts will not be described and only the differences between the eighth and tenth embodiments will be described. In the tenth embodiment, three smoothing capacitors 121, 122 and 123 are mounted on the printed circuit board 101 so as to be located on a plane perpendicular to an axis of rotation of the mixed flow fan 106.

According to the tenth embodiment, non-uniformity in amounts of air blown to the three smoothing capacitors 121 to 123 can be reduced.

Figure 13:
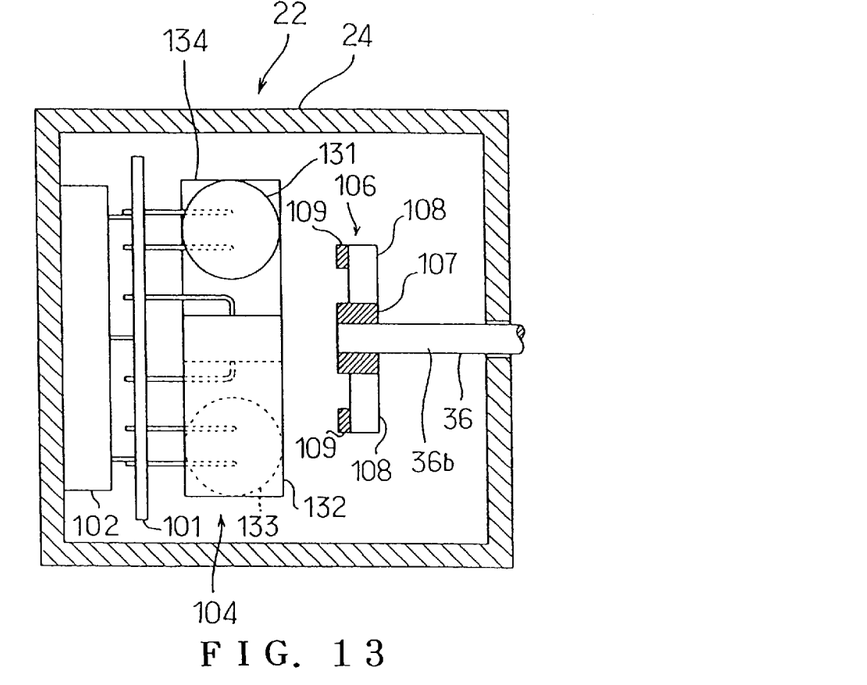
FIG. 13 is a longitudinally sectional side view of the enclosed control device of a eleventh embodiment in accordance with the invention.
Figure 14:
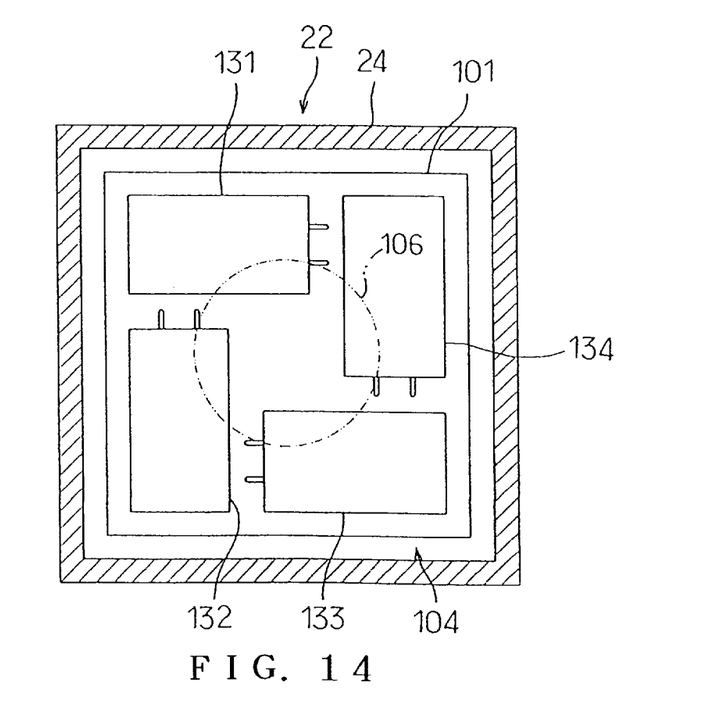
FIG. 14 is a plan view of the enclosed control device of the eleventh embodiment.

FIGS. 13 and 14 illustrate an eleventh embodiment of the invention. Identical or similar parts in the eleventh embodiment are labeled by the same reference symbols as in the tenth embodiment. These parts will not be described and only the differences between the tenth and eleventh embodiments will be described. In the eleventh embodiment, four smoothing capacitors 131 to 134 are mounted on the printed circuit board 101 so that the capacitors are located on a plane perpendicular to the direction blast and so that the capacitors are arranged symmetrically about the center of the blast area. Consequently, an amount of air blown to the capacitors 131 to 134 can be uniformed.

Figure 15:
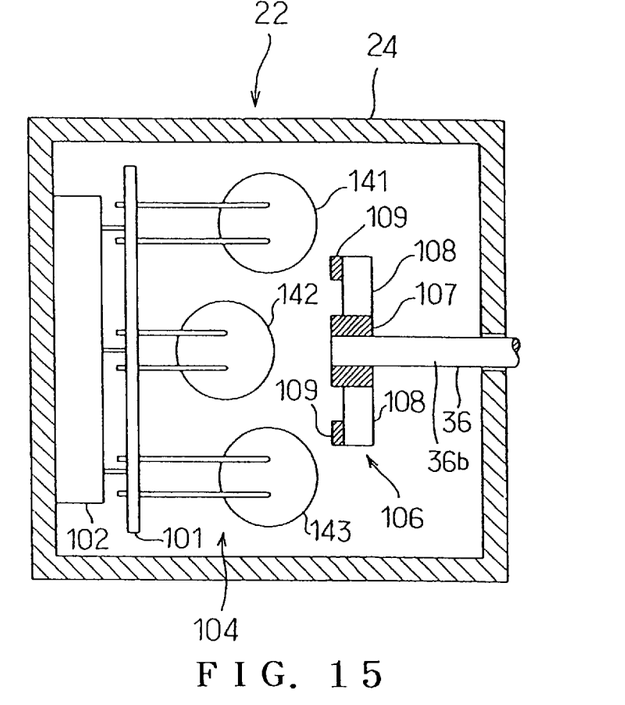
FIG. 15 is a longitudinally sectional side view of the enclosed control device of a twelfth embodiment in accordance with the invention.

FIG. 15 illustrates a twelfth embodiment of the invention. Identical or similar parts in the twelfth embodiment are labeled by the same reference symbols as in the tenth embodiment. These parts will not be described and only the differences between the tenth and twelfth embodiments will be described. In the twelfth embodiment, three smoothing capacitors 141, 142 and 143 are mounted on the printed circuit board 101 so as to be arranged on an arcuate plane with a curved side opposed to the blast area of the mixed flow fan 106.

According to the twelfth embodiment, distances between the smoothing capacitors is increased as compared with the arrangement of FIG. 12. Consequently, the interior of the casing 24 can readily be ventilated and air mixing can be reduced in a space around the fan 106.

Figure 16:
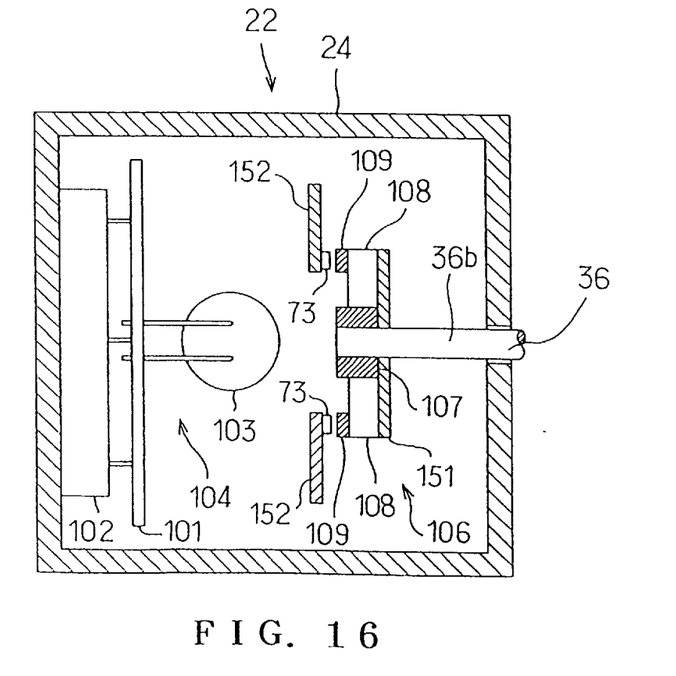
FIG. 16 is a longitudinally sectional side view of the enclosed control device of a thirteenth embodiment in accordance with the invention.

FIG. 16 illustrates a thirteenth embodiment of the invention. Identical or similar parts in the thirteenth embodiment are labeled by the same reference symbols as in the eighth embodiment. These parts will not be described and only the differences between the eighth and thirteenth embodiments will be described. In the thirteenth embodiment, an annular magnet 151 with circumferentially distributed opposite polarity is provided at the exhaust side of the mixed flow fan 106. The sensors 73 constituting the magnetic sensor 72 as described in the fifth embodiment are mounted on the base 152 at the suction side of the mixed flow fan 106. The sensors 73 are opposed to the magnet 151 with the fan blades 108 located therebetween. The base 152 is supported on a supporting member (not shown) further supported on the casing 24.

Particularly in the thirteenth embodiment, the sensors 73 are disposed at the suction side of the mixed flow fan 106 providing a large space. Consequently, the construction can be simplified as compared with the case where the sensors 73 are disposed at the narrow exhaust side of the fan 106. Furthermore, the cooling of the sensors 73 can also be enhanced.

Figure 17:
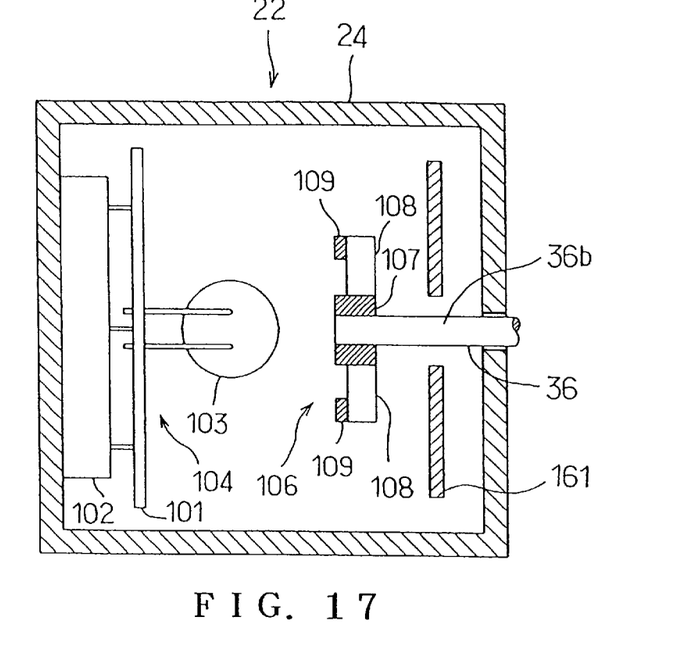
FIG. 17 is a longitudinally sectional side view of the enclosed control device of a fourteenth embodiment in accordance with the invention.

FIG. 17 illustrates a fourteenth embodiment of the invention. Identical or similar parts in the fourteenth embodiment are labeled by the same reference symbols as in the eighth embodiment. These parts will not be described and only the differences between the eighth and fourteenth embodiments will be described. In the fourteenth embodiment, a control board 161 through which the rotational shaft 36 extends is provided at the exhaust side of the mixed flow fan 106. A control electronic circuit is composed on the control board. Particularly in the thirteenth embodiment, the cooling of the control board 161 can also be enhanced by the flow of air blasted by the mixed flow fan 106.

Figure 18:
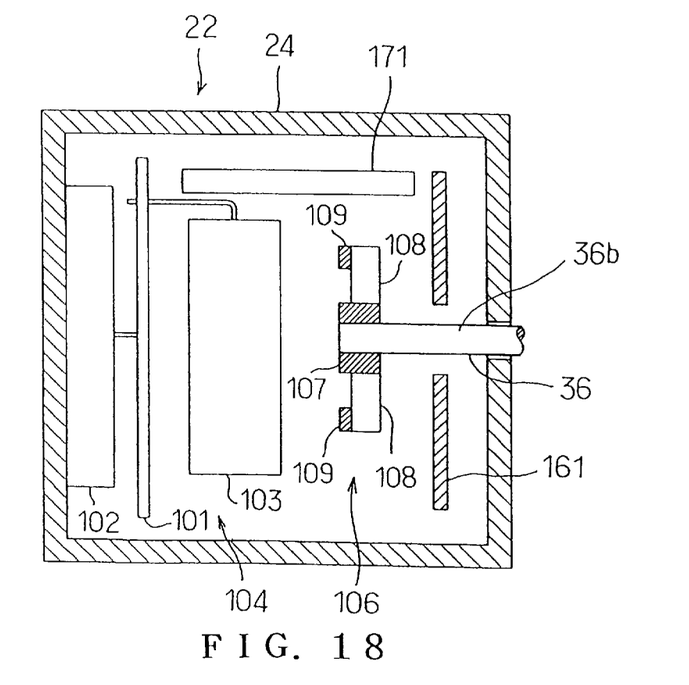
FIG. 18 is a plan view of the enclosed control device of a fifteenth embodiment in accordance with the invention.

FIG. 18 illustrates a fifteenth embodiment of the invention. Identical or similar parts in the fifteenth embodiment are labeled by the same reference symbols as in the fourteenth embodiment. These parts will not be described and only the differences between the fourteenth and fifteenth embodiments will be described. In the fifteenth embodiment, a terminal block 171 is provided at a location spaced from the mixed flow fan 106 in the direction of its outer circumference. Electric wires such as power supply wires and signal wires are connected to the terminal block 171. In this construction, the cooling of the terminal block 171 can also be enhanced by a flow of air blasted by the mixed flow fan 106.

Figure 19:
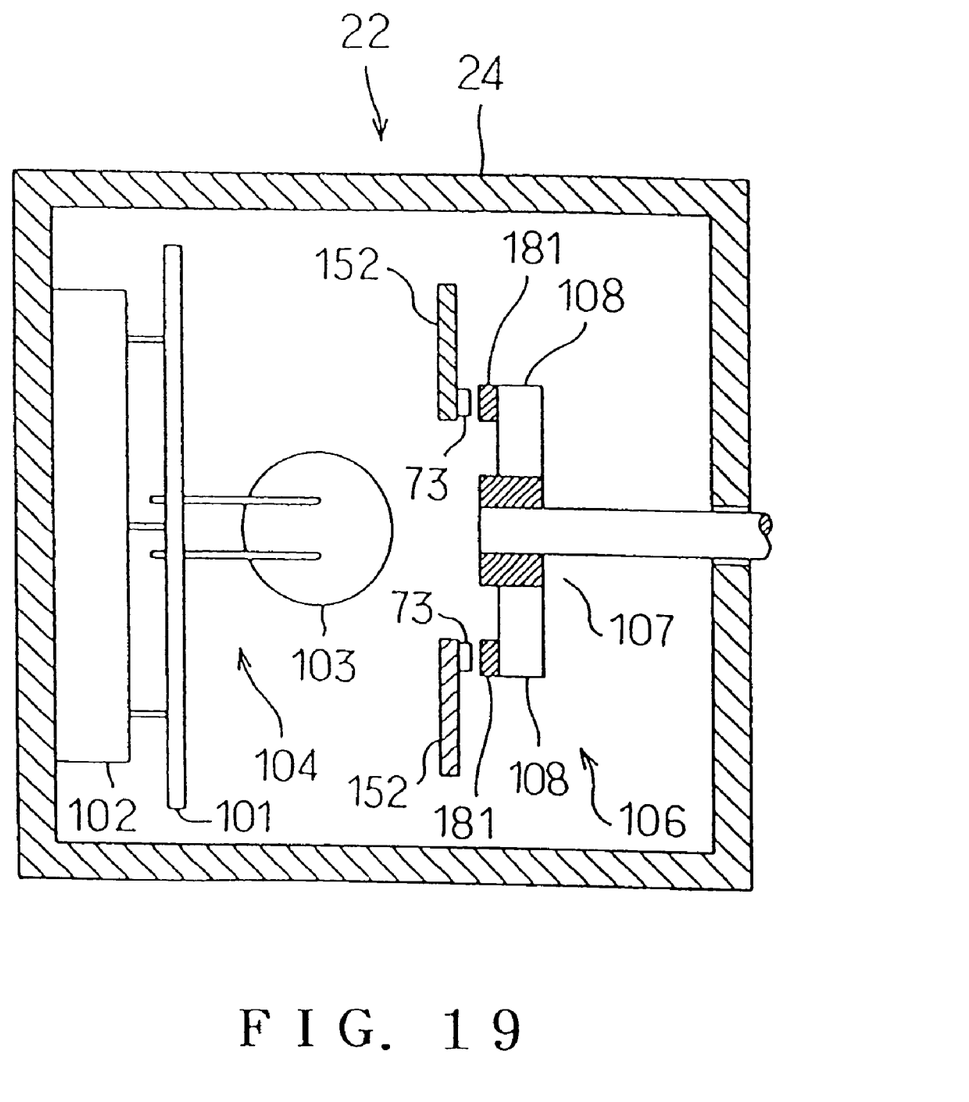
FIG. 19 is a longitudinally sectional side view of the enclosed control device of a sixteenth embodiment in accordance with the invention.

FIG. 19 illustrates a sixteenth embodiment of the invention. Identical or similar parts in the sixteenth embodiment are labeled by the same reference symbols as in the thirteenth embodiment. These parts will not be described and only the differences between the thirteenth and sixteenth embodiments will be described. In the sixteenth embodiment, a shroud 181 comprising an annular magnet is used instead of the shroud 109 used in the eighth to fifteenth embodiments. Particularly in the sixteenth embodiment, the magnet 151 used in the thirteenth embodiment can be eliminated and accordingly, the number of parts can be reduced.

In modifications, the present invention may be applied to devices comprising other electric circuits although the invention has been applied to the inverter in the foregoing embodiments. In the first embodiment, an external fan for cooling the casing may be provided outside the casing together with the internal centrifugal fan 18. In the eighth to fifteenth embodiments, the centrifugal fan may be provided instead of the mixed flow fan.

The foregoing description and drawings are merely illustrative of the principles of the present invention and are not to be construed in a limiting sense. Various changes and modifications will become apparent to those of ordinary skill in the art. All such changes and modifications are seen to fall within the scope of the present invention as defined by the appended claims.

We claim:

1. An enclosed control device integrated with a dynamoelectric machine, said enclosed control device comprising:

a casing provided on the dynamoelectric machine, wherein the casing has a side wall;

an electronic circuit enclosed by the casing, wherein the electronic circuit is connected to and drives the dynamoelectric machine, and wherein the dynamoelectric machine and the electronic circuit are located on opposite sides of the side wall;

a rotating member extending through the side wall and rotated by a rotational shaft of the dynamoelectric machine; and agitating means provided in the casing and rotated by the rotating member for agitating air in the casing to transfer heat from the electronic control circuit to the casing.

2. An enclosed control device according to claim 1, wherein the rotating member forms a part of the rotational shaft of the dynamoelectric machine and has a smaller diameter than the rotational shaft.

3. An enclosed control device according to claim 1, wherein the rotating member is discrete from the rotational shaft of the dynamoelectric machine.

4. An enclosed control device according to claim 2, wherein the agitating means includes a cylindrical portion covering the rotating member.

5. An enclosed control device according to claim 1, wherein the agitating means is made of a material having a smaller heat conductivity than a material of the rotating member.

6. An enclosed control device according to claim 19 which further comprises rotation detecting means provided in the casing for detecting rotation of the rotational shaft of the dynamoelectric machine by sensing rotation of the agitating means.

7. An enclosed control device according to claim 1, wherein the dynamoelectric machine is a motor and wherein the electronic circuit is an inverter circuit that is integrated with and drives the motor.

8. An enclosed control device according to claim 6, wherein the rotation detecting means includes a member that is mounted on and rotates with the agitating means.

* * * * *